(12) United States Patent
Rieger et al.

(10) Patent No.: US 8,459,112 B2
(45) Date of Patent: Jun. 11, 2013

(54) SYSTEMS AND METHODS FOR THREE DIMENSIONAL SENSORS

(75) Inventors: Ryan W. Rieger, San Jose, CA (US); Lakshman Withanawasam, Maple Grove, MN (US); Ronald J. Jensen, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/156,758

(22) Filed: Jun. 9, 2011

(65) Prior Publication Data

US 2012/0313193 A1    Dec. 13, 2012

(51) Int. Cl.
*H01L 23/02*    (2006.01)

(52) U.S. Cl.
USPC ... 73/514.16; 73/493; 73/514.01; 257/E23.01

(58) Field of Classification Search
USPC ........ 257/E23.01; 438/50, 51, 106; 73/170.8, 73/170.9, 493, 514.01, 514.16
See application file for complete search history.

(56) References Cited

U.S. PATENT DOCUMENTS

| | | | |
|---|---|---|---|
| 4,163,326 A | | 8/1979 | Edwards |
| 4,306,436 A | | 12/1981 | Schulz et al. |
| 5,521,500 A | | 5/1996 | Schuhl et al. |
| 5,554,806 A | * | 9/1996 | Mizuno et al. .................. 73/493 |
| 6,060,780 A | * | 5/2000 | Ohta et al. .................... 257/731 |
| 6,556,007 B1 | | 4/2003 | Abe et al. |
| 6,808,955 B2 | * | 10/2004 | Ma ................................. 438/51 |
| 6,918,186 B2 | | 7/2005 | Ash et al. |
| 7,095,226 B2 | | 8/2006 | Wan et al. |
| 7,126,330 B2 | | 10/2006 | Peczalski |
| 7,145,330 B2 | | 12/2006 | Xiao |
| 7,237,437 B1 | | 7/2007 | Fedora |
| 7,271,586 B2 | | 9/2007 | Bohlinger et al. |
| 7,467,552 B2 | * | 12/2008 | MacGugan ..................... 73/493 |
| 7,509,748 B2 | | 3/2009 | Xue et al. |
| 7,536,909 B2 | | 5/2009 | Zhao |
| 7,559,148 B2 | | 7/2009 | Hayama |
| 7,671,478 B2 | | 3/2010 | Wathanawasam |
| 7,748,272 B2 | * | 7/2010 | Kranz et al. .................... 73/493 |
| 7,813,851 B2 | * | 10/2010 | DeMersseman et al. .... 701/30.5 |
| 7,830,000 B2 | | 11/2010 | Eichelberger et al. |
| 7,870,678 B2 | | 1/2011 | Kwon et al. |

(Continued)

FOREIGN PATENT DOCUMENTS

EP         2194391          6/2010

OTHER PUBLICATIONS

U.S. Patent and Trademark Office, "Notice of Allowance", "U.S. Appl. No. 13/101,492", Sep. 20, 2012, pp. 19.

(Continued)

*Primary Examiner* — Eduardo A Rodela
(74) *Attorney, Agent, or Firm* — Fogg & Powers LLC (57) ABSTRACT

Systems and methods for fabricating a multi-axis sensor are provided. In one implementation, a method comprises: fabricating a first die having a first active surface with first application electronics; fabricating a second die having a second active surface with second application electronics and a plurality of electrical connections that extend from the second application electronics to a side surface interface of the second die that is adjacent to the second active surface; aligning the side surface interface to be coplanar with the first active surface; and forming at least one electrical connection between the plurality of electrical connections and the first active surface.

10 Claims, 6 Drawing Sheets

U.S. PATENT DOCUMENTS

| | | | |
|---|---|---|---|
| 2010/0221860 A1* | 9/2010 | Hawat et al. | 438/51 |
| 2010/0223797 A1 | 9/2010 | Peczalski | |
| 2011/0234218 A1 | 9/2011 | Lagouge | |
| 2012/0279077 A1 | 11/2012 | Withanawasam et al. | |
| 2012/0299587 A1 | 11/2012 | Rieger et al. | |

OTHER PUBLICATIONS

"Comparison of Hall Effect and MR Technologies", "Sensing and Control: Appendix E", Oct. 15, 1998, pp. 101-102, Publisher: Honeywell.

Babinetz, "Wire Bonding Solutions for 3-D Stacked Die Packages", "Electronics Manufacturing Engineering", May 2003, pp. 1-10.

Caruso, Michael J., "Applications of Magnetoresistive Sensors in Navigation Systems", "Available at http://www.ssec.honeywell.com/position-sensors/datasheets/sae.pdf accessed Apr. 7, 2011", Feb. 16, 1998, pp. 1-8, Publisher: Honeywell Inc.

Fang et al., "Design of a Wireless Assisted Pedestrian Dead Reckoning System—The NavMote Experience", "IEEE Transactions on Instrumentation and Measurement", Dec. 2005, pp. 2342-2358, vol. 54, No. 6, Publisher: IEEE.

Garcia, "Hall Effect Sensors Magneto Resistive Sensors Magneto Resistive Detector", "Available at http://sandoval-gonzalez.com/5_hall.pdf accessed Apr. 7, 2011", Oct. 14, 2009, pp. 1-26.

"Hall Effect Sensing and Application", "Micro Switch Sensing and Control", Oct. 14, 1998, pp. 1-126, Publisher: Honeywell.

Jander et al., "Magnetoresistive Sensors for Nondestructive Evaluation", "Presented at the 10th SPIE International Symposium, Nondestructive Evaluation for Health Monitoring and Diagnostics, Conference 5770", 2005, pp. 1-13, Publisher: NVE Corporation.

Popovic et al., "Bridging the Gap Between AMR, GMR, and Hall Magnetic Sensors", "Proceedings of the 23rd International Conference on Microelectronics, May 12-15, 2002", May 2002, pp. 55-58, vol. 1, Publisher: IEEE, Published in: Yugoslavia.

U.S. Patent and Trademark Office, "Office Action", "U.S. Appl. No. 13/101,492", Jun. 13, 2012.

U.S. Patent and Trademark Office, "Office Action", "U.S. Appl. No. 13/116,844", Aug. 14, 2012.

* cited by examiner

SYSTEMS AND METHODS FOR THREE DIMENSIONAL SENSORS

BACKGROUND

Magnetometers are used in portable electronic devices to provide directional information. Because the physical space inside such devices is small, the magnetometer used in them must be sized accordingly. As such, integrated circuit magnetometers are used because very small sensors can be fabricated.

One limitation of integrated circuit magnetometers is that three dimensional sensors cannot currently be fabricated on a single die. Instead, separate sensor die must be orthogonally arranged and assembled together to form a three dimensional sensor device. Typically, this arrangement requires at least one of the die to be rotated so that its active circuit is perpendicular to a non-rotated die. This creates the need to electrically connect surfaces that are perpendicular to each other, which is both difficult and expensive using current technologies.

For the reasons stated above and for other reasons stated below which will become apparent to those skilled in the art upon reading and understanding the specification, there is a need in the art for improved systems and methods for three dimensional sensors.

SUMMARY

The Embodiments of the present invention provide methods and systems for connecting orthogonal dies and will be understood by reading and studying the following specification.

In one embodiment, a method for fabricating a multi-axis sensor is provided. The method includes: fabricating a first die having a first active surface with first application electronics; fabricating a second die having a second active surface with second application electronics and a plurality of electrical connections that extend from the second application electronics to a side surface interface of the second die that is adjacent to the second active surface; aligning the side surface interface to be coplanar with the first active surface; and forming at least one electrical connection between the plurality of electrical connections and the first active surface.

BRIEF DESCRIPTION OF DRAWINGS

Embodiments of the present disclosure can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the exemplary embodiments. Reference characters denote like elements throughout figures and text.

DETAILED DESCRIPTION

In the following detailed description, references are made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual acts may be performed. The following detailed description is, therefore, not to be taken in a limiting sense.

Embodiments of the present invention address the need to electrically connect orthogonally oriented sensor die by extending a connection interface from a vertically oriented sensor die towards a side surface of the vertically oriented sensor. The side surface of the vertically mounted sensor die is aligned with a horizontal surface comprising a horizontally oriented sensor. The connection interface on the side surface of the vertically oriented sensor is connected to the horizontal surface of the horizontally oriented sensor. As will be explained in greater detail below, aligning the surface of the horizontally oriented sensor with the side surface of the vertically oriented sensor also facilitates the mounting of the sensors to other components such as a printed circuit board (PCB) or other electronic device.

Figure 1:
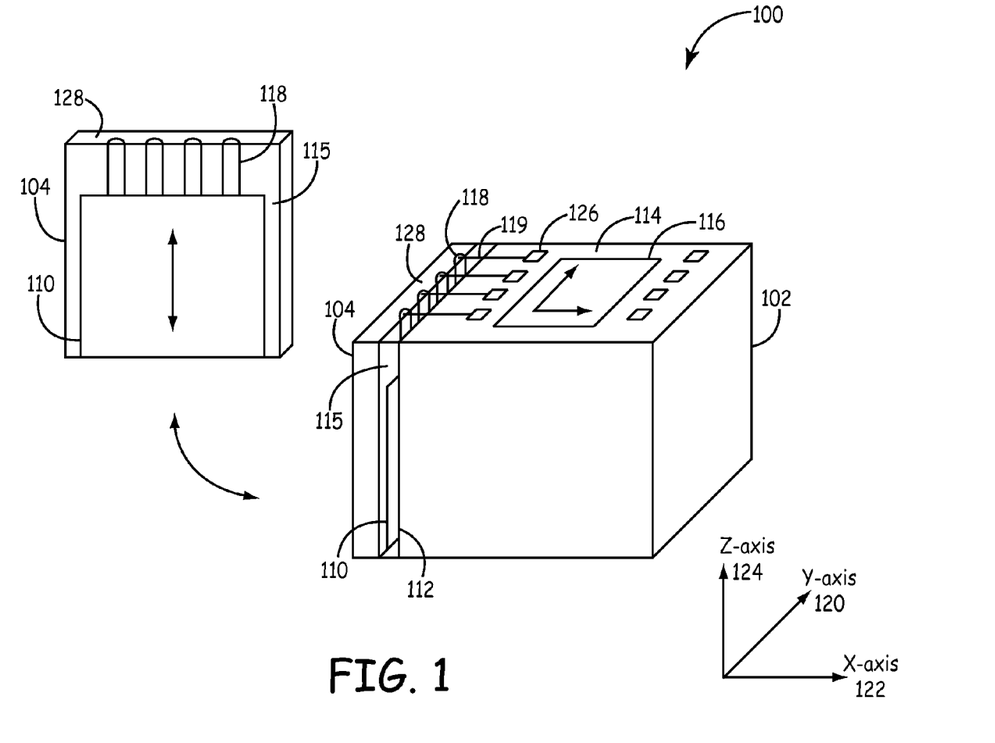
FIG. 1 is a block diagram illustrating a sensor according to one embodiment.

FIG. 1 is a diagram illustrating an integrated circuit device that includes application electronics for performing applications along multiple axes. That is, the application electronics include sensors that sense along multiple axes. In the embodiment shown in FIG. 1, an integrated circuit sensor device 100 senses along a y-axis 120, a x-axis 122, and a z-axis 124. In one embodiment, sensor device 100 comprises magnetic sensors capable of measuring the components of magnetic fields. In such an embodiment, sensor device 100 utilizes one or more of a variety of magnetic sensing technologies to measure a magnetic field. For example, sensor device 100 can sense magnetic fields using anisotropic magnetoresistive (AMR) sensors, giant magnetoresistive (GMR) sensors, tunneling magnetoresistive (TMR) sensors, magnetic impedance (MI) sensors, and the like. In other embodiments, the application electronics provide for other sensing functions such as inertial or rotational sensors.

As shown in FIG. 1, sensor device 100 includes a first die 102 comprising a horizontally oriented active surface 114 and a second die 104 comprising a vertically oriented active surface 115. The terms "horizontal" and "vertical," as used herein, are relative to the base to which sensor device 100 is mounted and indicate that active surface areas of die 102 and die 104 are arranged orthogonally to one another.

In one embodiment, die 102 is fabricated as an integrated circuit die having at least one application sensor 116 fabricated upon active surface 114. In the particular embodiment shown in FIG. 1, application sensor 116 comprises an in-plane sensor that senses along two orthogonal axes (the x-axis 122 and y-axis 120). That is, application sensor 116 is only able to sense in directions that lie in the plane of active surface 114. It is not able to sense components of a magnetic field that are orthogonal to the plane containing active surface 114. Die 104 is also fabricated as an integrated circuit having at least one application sensor 110 fabricated on an active surface 115. Like application sensor 116, application sensor 110 is also formed in the plane of an active surface. Application sensor 110 is oriented to sense along at least one axis that is orthogonal to the two axes sensed by sensor 116. In an alternate embodiment, application sensor 116 senses along a single axis (such as x-axis 122, for example) while application sensor 110 senses along the other two orthogonal axes (y-axis 120 and z-axis 124, for example).

The active surface 115 is horizontally oriented during the fabrication of application sensor 110. Then, when die 102 and die 104 are assembled together through wafer reconstruction, die 104 is rotated such that the plane of active surface 115 is perpendicular to the plane of active surface 114. For example, when horizontal application sensor 116 senses along y-axis 120 and x-axis 122 in the plane of horizontal active surface 114, die 104 is rotated such that vertical application sensor 110 senses along z-axis 124 in the plane of vertical active surface 115. As such, combining application sensor 110 with application sensor 116 to form a single wafer, allows a sensor device 100 to sense along three orthogonal axes (y-axis 120, x-axis 122, and z-axis 124, for example).

After die 104 is rotated, a bonding means bonds die 104 to die 102. The bonding means may include a poly-fill or other integrated circuit bonding material. By bonding die 104 to die 102, sensor 100 becomes a single reconstructed wafer capable of sensing direction along three orthogonal axes. In one implementation, active surface 115 is bonded to a vertical side surface 112 of die 102. Alternatively, any side of die 104 can be bonded to vertical side surface 112 while active surface 115 is maintained in an orthogonal orientation in reference to active surface 314.

To electrically connect application sensor 110 to application sensor 116, die 104 includes a plurality of vertical electrical connections 118 that extend from application sensor 110 towards a horizontal side surface interface 128 of die 104. As shown in FIG. 1, side surface interface 128 is aligned with active surface 114 such that side surface 128 and active surface 114 are aligned within the same plane. Then, interconnects 119 are formed on sensor 100 between vertical electrical connections 118 on die 104 and application sensor 116 on active surface 114 of die 102. In one embodiment interconnects 119 are fabricated to be in the same plane as side surface interface 128 and active surface 114. A plurality of bonding pads 126 are provided on surface 114 to interconnect sensor 100 with other devices such as a printed circuit board or other integrated circuits.

Figure 2:
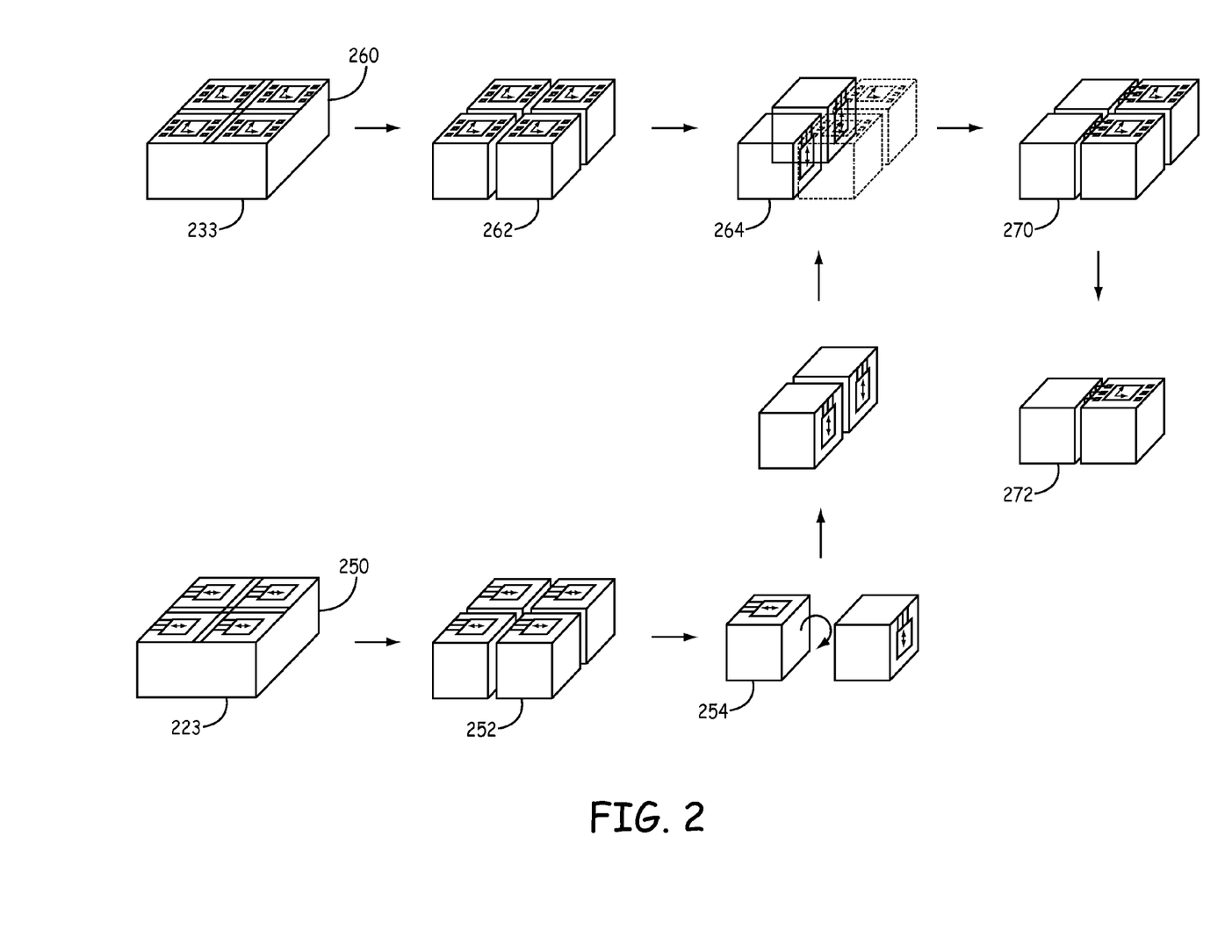
FIG. 2 is a block diagram illustrating fabrication of sensors according to one embodiment of the present invention.

FIG. 2 is a diagram illustrating a process for fabricating a sensor device 100 as described in FIG. 1. A plurality of single-axis sensors are formed on a first wafer (as shown at 250) and a plurality of two-axis sensors are formed on a second wafer (as shown at 260). The two wafers may be based on any of the technologies discussed above. The first wafer is singulated into individual single-axis sensor die (shown at 252) by sawing the first wafer into rows and columns of single-axis sensor die. The singulation of the first wafer also exposes vertical electrical connections 118. The second wafer is singulated into individual two-axis sensor die (shown at 262) by sawing the second wafer into rows and columns of two-axis sensor die. As shown at 254, the individual single axis sensor dies are rotated so that the active surfaces are vertically oriented. Referring back to FIG. 1, die 104 is shown with vertical electrical connections 118 extending from sensor 110 to side surface interface 128. Accordingly, rotation of the single axis sensor die also serves to align the side surface interface 128 for each of the die so that their respective vertical electrical connections 118 are aligned with the plane formed by the active surface 114 of the non-rotated two-axis sensor die as shown at 264.

The individual single-axis sensor dies and the individual non-rotated two-axis sensor dies are bonded to one another to form a reconstructed wafer. When the wafer is reconstructed, the performance of wafer level processes electrically connect the individual single-axis sensor dies to the individual two-axis sensor dies. This is illustrated at 270. In one implementation, the vertical electrical connections 118 are polished to prepare the connections 118 for connection to a metallization layer. When connections 118 are polished, an insulating layer is deposited over the reconstructed wafers and a pattern for forming contacts to the bonding pads 126 and 118 is etched into the insulating layer. To form the electrical connections, a metallization layer is deposited over the side surface interface and the first active surface, forming an electrical connection between the contacts etched into the insulating layer. When the metallization layer is deposited, another pattern is etched into the metallization layer to remove portions of the metallization layer and complete the formation of the electrical connection between the first die 102 and the second die 104. The resulting three-axis sensors is then separated into individual sensors (shown at 272).

In some embodiments, the die are background to reduce the amount of space occupied by the final sensor device. For example, material unnecessary for operation is back-ground from the bottom side of die produced from the first wafer (shown at 223) which results in the reduced size of the rotated die. Further, unnecessary material is removed from the bottom surface of the second wafer (shown at 233) to match the height of die 104.

Figure 3:
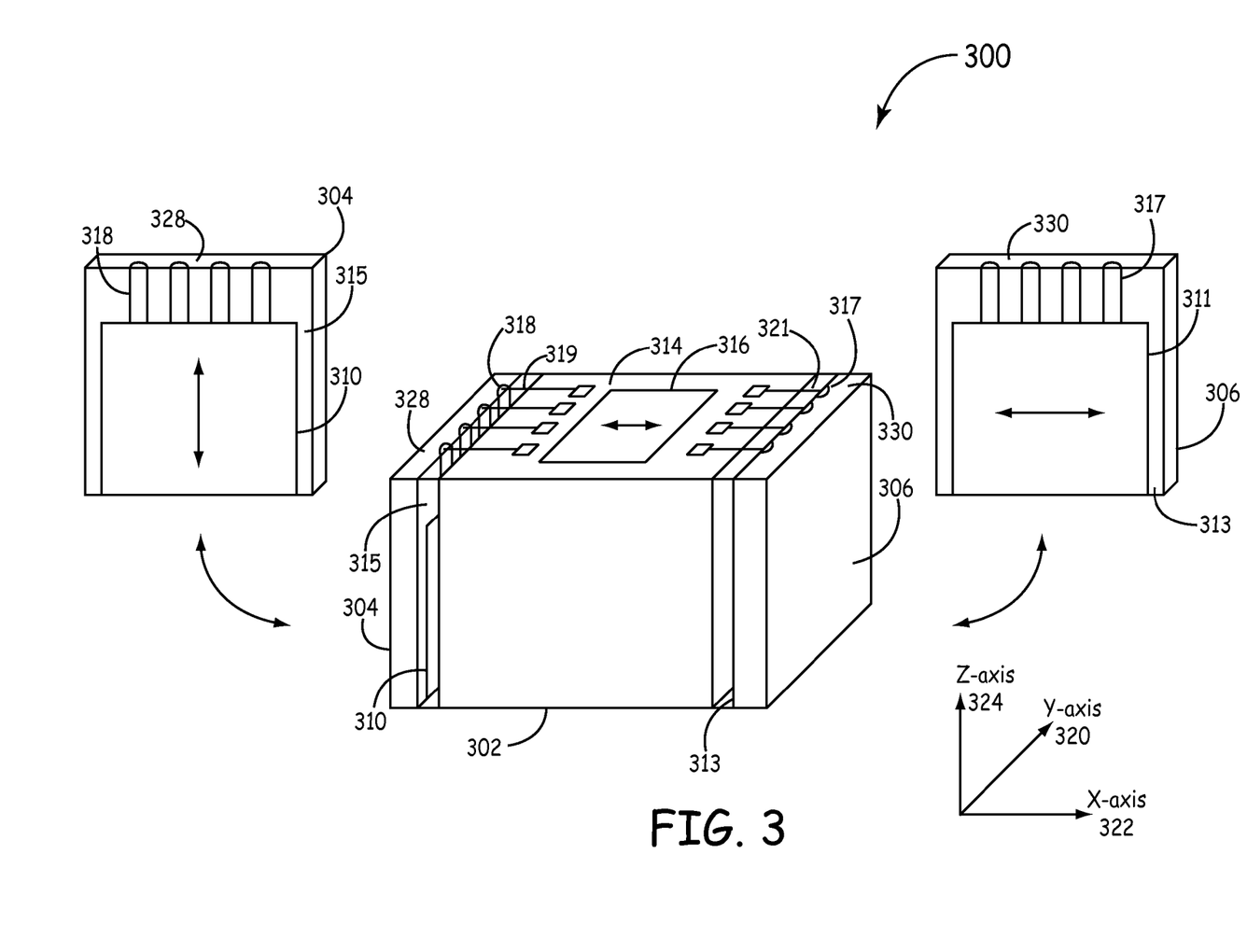
FIG. 3 is a block diagram illustrating a sensor according to one embodiment of the present invention.

FIG. 3 is a diagram illustrating another embodiment of a three axis sensor device (shown generally at 300) where three single axis wafers are joined together to form a sensor device 300 capable of sensing along three orthogonal axes. Sensor device 300 includes a first die 302, a second die 304, and a third die 306.

Die 302 includes a horizontally oriented active surface 314, and an application sensor 316 fabricated on active surface 314. Application sensor 316 is capable of sensing along axes that are within the plane formed by active surface 314. For example, as shown in FIG. 3, the plane formed by active surface 314 contains the y-axis 320 and the x-axis 322. Therefore, application sensor 316, lying on active surface 314 can sense along x-axis 322, y-axis 320, or other axis in the plane of the x-axis 322 and y-axis 320.

Second die 304 includes application sensor 310 formed on a vertically oriented active surface 315 and electrical connection 318 formed on side surface interface 328. As application sensor 310 lies on active surface 315, application sensor 310 senses in the plane containing active surface 315. As shown in FIG. 3, active surface 315 is in the plane formed by z-axis 324 and y-axis 320. As application sensor 310 senses within the plane formed by active surface 315, application sensor 310 can sense along z-axis 324, y-axis 320, or combination of z-axis 324 and y-axis 320.

The third die 306 includes an application sensor 311 formed on a vertically oriented active surface 313 and electrical connection 317 formed on a side surface interface 330. As application sensor 311 lies on active surface 313, application sensor 311 senses in the plane containing active surface 313. As shown in FIG. 3, active surface 313 is in the plane formed by z-axis 324 and y-axis 320. As application sensor 311 senses within the plane containing active surface 313, application sensor 311 can sense along z-axis 324, y-axis 320, or combination of z-axis 324 and y-axis 320. In order to provide sensitivity in all three dimensions, application sensor 311 senses along an axis that is orthogonal to the axis sensed by application sensor 310 in addition to the axis sensed by application sensor 316. Sensors 310, 311 and 316 utilize any of the sensor technologies described above with respect to FIG. 1.

Second die 304 and third die 306 are bonded to first die 302 in a similar manner as described above with respect to FIG. 2. When die 304 and 306 are bonded to die 302, they are arranged with respect to die 302 such that side surface interface 328 and side surface interface 330 are aligned with active surface 314. When side surface interface 328 is aligned with active surface 314, connections 318 are connected to active surface 314 via interconnections 319. When side surface interface 330 is aligned with active surface 314, connections 317 are connected to active surface 314 via interconnections 321. The interconnections of the aligned surfaces allows interconnections 319 and 321 to be fabricated on a single planar surface.

Although FIG. 3 illustrates die 304 and die 306 bonded to opposing sides of die 302, in other embodiments they are boded to adjacent sides of die 302 so that active surface 315 and active surface 313 lie in planes orthogonal to one another.

Figure 4:
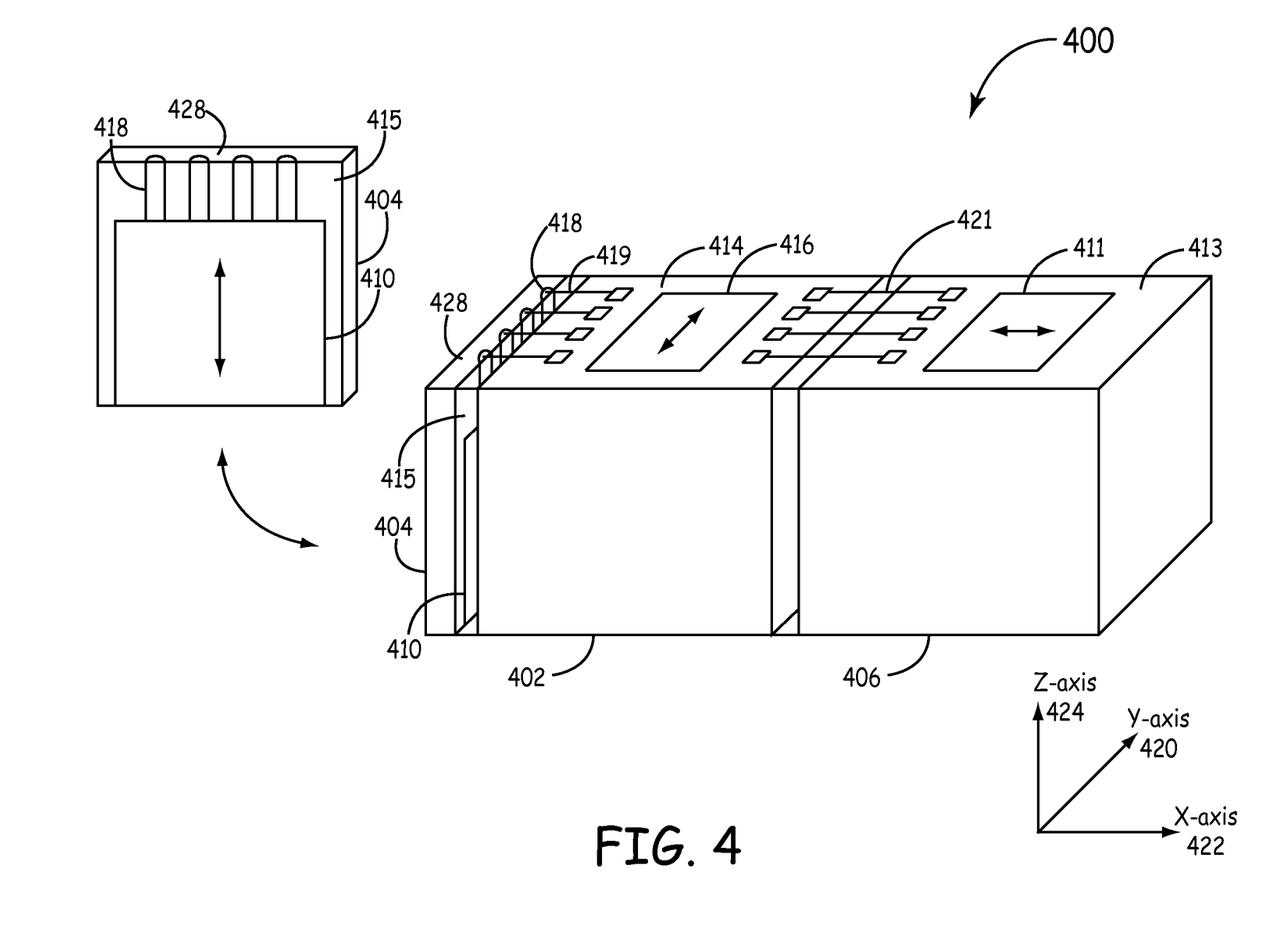
FIG. 4 is a block diagram illustrating a sensor according to one embodiment of the present invention.

FIG. 4 is a diagram illustrating another embodiment of a three axis sensor device (shown generally at 400) where three single-axis wafers are joined together to form a sensor device 400 capable of sensing along three orthogonal axes. Sensor device 400 includes a first die 402, a second die 404, and a third die 406. The use of three single-axis wafers allows for the formation of a three axis wafers using three identically designed devices.

First die 402 includes a first horizontally oriented active surface 414, and an application sensor 416 fabricated on active surface 414. Application sensor 416 is capable of sensing along axes that are within the plane formed by active surface 414. For example, as shown in FIG. 4, the plane formed by active surface 414 contains the y-axis 420 and the x-axis 422. Therefore, application sensor 416, lying on active surface 414 senses along x-axis 422, y-axis 420, or other axis in the plane of the x-axis 422 and y-axis 420.

Third die 406 is similar to first die 402 and includes a second horizontally oriented active surface 413, and an application sensor 411 fabricated on active surface 413. Application sensor 411 is capable of sensing along axes that are within the plane formed by active surface 413. For example, as shown in FIG. 4, the plane formed by active surface 413 is the same plane that contains active surface 414, which contains the y-axis 420 and the x-axis 422. Therefore, application sensor 411, lying on active surface 413 senses along x-axis 422, y-axis 420, or other axis in the plane of the x-axis 422 and y-axis 420. Further, sensor 411 senses in an axes that is orthogonal to the axes sensed by sensor 416. For example, when sensor 416 senses along y-axis 420, sensor 411 senses along x-axis 422. Also, third die 406 is bonded to side surface of first die 406 and is electrically connected to first die 406 through wafer processes as described above.

Second die 404 includes application sensor 410 formed on a vertically oriented active surface 415 and electrical connection 418 formed on side surface interface 428. As application sensor 410 lies on active surface 415, application sensor 410 senses in the plane containing active surface 415. As shown in FIG. 4, active surface 415 is in the plane formed by z-axis 424 and y-axis 420. As application sensor 410 senses within the plane formed by active surface 415, application sensor 410 senses along z-axis 424, y-axis 420, or combination of z-axis 424 and y-axis 420. Second die is bonded to first die 402 or third die 406 in a similar manner as described above with respect to FIG. 2. When die 404, 406, and 402 are joined to form a reconstructed wafer, the side surface interface 428 is aligned with active surfaces 414 and 413. When side surface interface 428 is aligned with active surfaces 414 and 413, connections 418 are connected to active surface 414 or active surface 413 via interconnections 419.

Figure 5A:
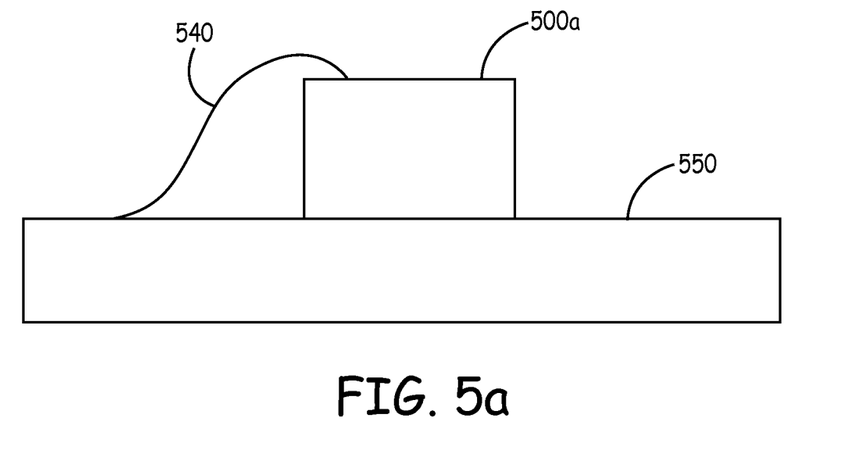
FIGS. 5a-b are each block diagrams illustrating mounting of a sensor on a mounting surface of one embodiment of the present invention.
Figure 5B:
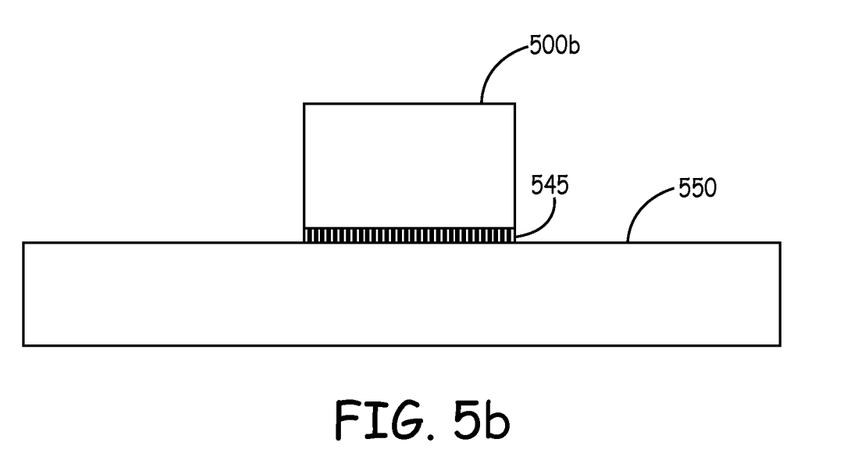

FIGS. 5a-b illustrate the mounting of a sensor device. In FIG. 5a, sensor device 500a is bonded to a mounting surface 550 and electrically connected to mounting surface 550 via a wire bond 540. For example, the base of sensor device 500a is bonded to mounting surface 550, where sensor device 500a functions similarly to sensor device 100 in FIG. 1, sensor device 300 in FIG. 3, or sensor device 400 in FIG. 4. Mounting surface 550 can be a printed circuit board (PCB), or other surface. To connect sensor device 500a to mounting surface 550, a wire is bonded to the bonding pads located on the horizontal active surface of sensor device 500a. The bonding pads are shown in FIG. 1 as bonding pads 126. When the wire is bonded to the bonding pads located on the horizontal active surface of sensor device 500a, the wire is connected to the mounting surface 550.

Alternatively, FIG. 5b illustrates a sensor device 500b bonded to a mounting surface 550 and electrically connected to mounting surface 550 via a flip-chip connection 445. For example, the horizontal active surface of sensor device 500b can be directly connected to mounting surface 550. When the horizontal active surface of sensor device 500b is directly connected to mounting surface 550, the bonding pads located on the horizontal active surface of sensor device 500b are bonded directly to mounting surface 550.

Figure 6:
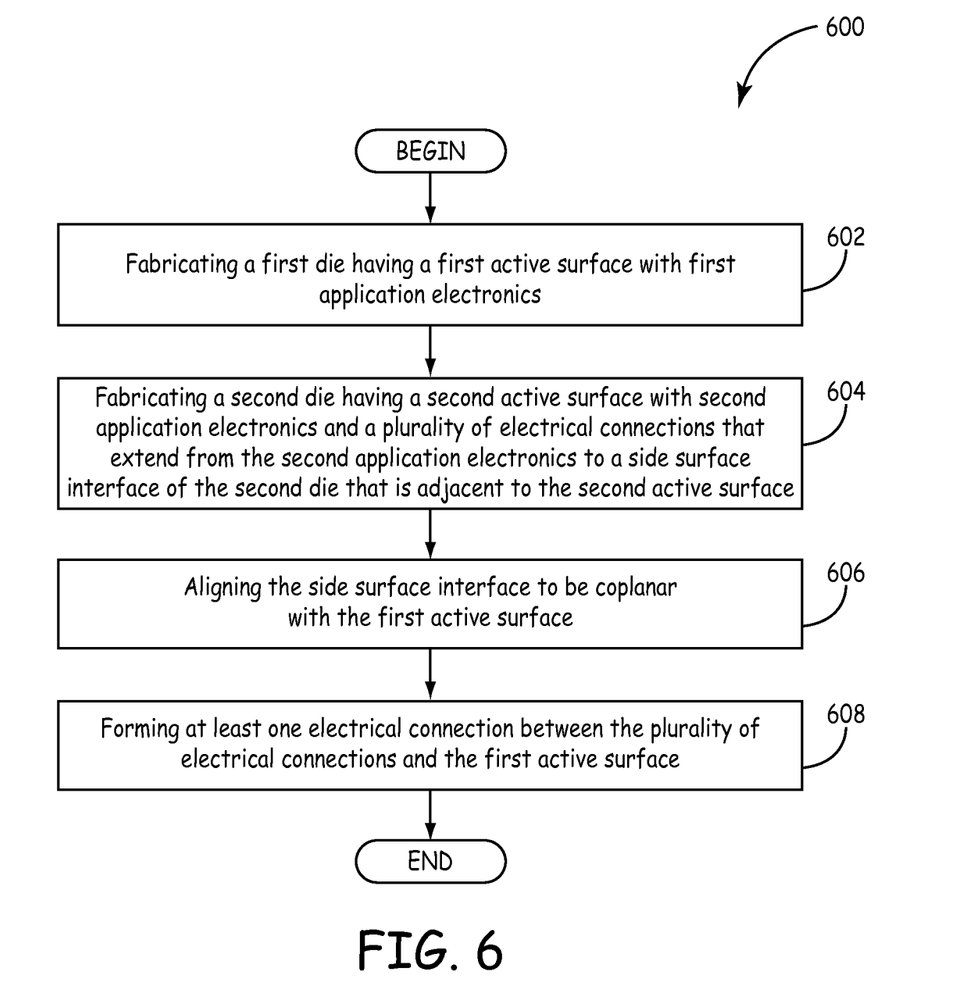
FIG. 6 is a flow diagram of a method of one embodiment of the present invention.

FIG. 6 is a flow diagram illustrating a method 600 for electrically connecting a first die to a second die to fabricate a multi-axis sensor. The method begins at 602 with fabricating a first die having a first active surface with first application electronics. The first application electronics are designed to perform a measurement function that is sensitive along at least one directional axis that lies within the plane of the first active surface. For example, in one embodiment the application electronics comprise either a single axis or two-axis magnetic sensor.

The method proceeds to 604 with fabricating a second die having a second active surface with second application electronics and a plurality of electrical connections that extend from the second application electronics to a side surface interface of the second die that is adjacent to the second active surface. As with the first die, the application electronics are designed to perform a measurement function that is sensitive along at least one directional axis that lies within the plane of the first active surface. In one embodiment the second application electronics comprise either a single axis or two-axis magnetic sensor. The interface on the side surface provides access to the plurality of electrical connections that interconnect with the second application electronics.

The method proceeds to 606 with aligning the side surface interface to be coplanar with the first active surface. For example, the second die is rotated such that the side surface interface of the second die aligns with the first active surface and the first active surface and the side surface are within the same plane. In one embodiment, aligning the side surface to be coplanar with the first active surface further comprises rotating the second die such that the first active surface is oriented orthogonal with respect to the first active surface.

The method proceeds to 608 with forming at least one electrical connection between the plurality of electrical connections and the first active surface. Forming the electrical connection is performed using wafer level processes. In one embodiment, forming the electrical connection comprises polishing the interface on the side surface to prepare the interface for connecting to a metallization layer. When the side surface is polished, an insulator layer is deposited over the reconstituted wafers and a pattern for forming contacts to bonding pads is etched into the insulator layer. To form the electrical connections, a metallization layer is deposited over the side surface interface and the first active surface to connect the contacts.

In one embodiment, the first die is bonded to the second die with poly-fill such that the second active surface is bonded to a vertical side surface of the first die. In one embodiment, the method further comprising mounting the first die and second die to a printed circuit board. As mentioned with respect to FIGS. 3 and 4, in some alternate embodiments, the method comprises utilizing three independent single axis sensing die. In one such embodiment, the method would further comprise fabricating a third die, the third die comprising a third active surface with third application.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A directional sensor apparatus, the apparatus comprising:
    a first die including a first active surface with first application electronics;
    a second die bonded to a side surface of the first die, wherein the side surface is adjacent to the first active surface, the second die including:
        a second active surface with second application electronics, wherein the second active surface is oriented perpendicular to the first active surface; and
        a plurality of electrical connections extending from the second application electronics to a side surface interface of the second die that is adjacent to the second active surface, wherein the side surface interface of the second die is co-planar with the first active surface; and
    at least one electrical interconnect between the plurality of electrical connections and the first active surface.

2. The apparatus of claim 1, wherein the first application electronics and the second application electronics each further comprise in-plane magnetic sensors.

3. The apparatus of claim 2, wherein the first application electronics comprises a two-axis magnetic sensor.

4. The apparatus of claim 2, wherein the second application electronics comprises a two-axis magnetic sensor.

5. The apparatus of claim 1, wherein the first die is bonded to the second die by bonding the second active surface of the second die to the first die.

6. The apparatus of claim 1, wherein the at least one electrical connection comprises a metallization layer deposited over the side surface interface and the first active surface.

7. The apparatus of claim 1, further comprising a third die bonded to the first die, the third die including:
    a third active surface with third application electronics; and
    at least one electrical interconnect between the third active surface and the first active surface.

8. An apparatus for sensing multiple axes, the apparatus comprising:
    a first die having a first active surface;
    a second die that includes
        a second active surface, wherein the first active surface and the second active surface are contained within planes that are orthogonal to one another; and
        a connection side surface interface including a plurality of electrical connections each coupled to the second active surface, wherein the connection side surface interface is adjacent to the second active surface;
    a bonding material coupling the second die to a side surface of the first die, wherein the side surface is adjacent to the first active surface and the connection side surface is coplanar with the first active surface; and
    at least one electrical interconnection formed between the plurality of electrical connections to the first active surface.

9. The apparatus of claim 8, wherein the first application electronics and the second application electronics each further comprise in-plane magnetic sensors; and
    wherein the first application electronics and the second application electronics together provide for sensing of magnetic fields on three orthogonal axes.

10. The apparatus of claim 8, wherein the at least one electrical interconnection is formed using wafer level processes.

* * * * *